United States Patent [19]

Chisholm

[11] 4,216,580
[45] Aug. 12, 1980

[54] METHODS OF AND APPARATUS FOR ASSEMBLING ARTICLES WITH A SUPPORT

[75] Inventor: William M. Chisholm, Midlothian, Va.

[73] Assignee: Western Electric Company, Inc., New York, N.Y.

[21] Appl. No.: 971,159

[22] Filed: Dec. 20, 1978

[51] Int. Cl.³ .................. H05K 3/00; H05K 3/22; B23P 19/00
[52] U.S. Cl. ........................................ 29/842; 29/747
[58] Field of Search .................. 29/626, 747, 564.6, 29/753, 739, 54

[56] References Cited

U.S. PATENT DOCUMENTS

| 2,814,802 | 12/1957 | Maximoff . | |
|---|---|---|---|
| 2,871,551 | 2/1959 | Harris . | |
| 2,947,965 | 8/1960 | Scoville . | |
| 2,970,370 | 2/1961 | Weaver et al. . | |
| 3,067,902 | 12/1962 | Maximoff et al. . | |
| 3,429,039 | 2/1969 | Berg .......................... | 29/739 X |
| 3,545,606 | 12/1970 | Bennett . | |
| 3,550,250 | 12/1970 | Cervenka et al. . | |
| 3,562,903 | 2/1971 | Busler . | |
| 3,566,464 | 3/1971 | Bakermans . | |
| 3,641,646 | 2/1972 | Folk . | |
| 3,667,103 | 6/1972 | Petree . | |
| 3,676,926 | 7/1972 | Kendall . | |
| 3,711,922 | 1/1973 | Busler et al. . | |
| 3,769,679 | 11/1973 | Kendall . | |
| 3,812,569 | 5/1974 | Kufner et al. . | |
| 3,867,760 | 2/1975 | Horecky et al. . | |
| 3,875,636 | 4/1975 | Shultz, Jr. et al. . | |
| 3,946,477 | 3/1976 | Cobaugh et al. . | |

Primary Examiner—Francis S. Husar
Assistant Examiner—C. J. Arbes
Attorney, Agent, or Firm—J. B. Hoofnagle

[57] ABSTRACT

A plurality of pins (24) held at opposite ends by carrier strip (48 and 50) is positioned within a pin applicator (54) where the pins are moved into nests (66) of a stationary jaw (56). As the pins (24) are moved by a movable jaw (58) into the nests (66), the carrier strip (48) engages a stripper bar (70) to separate the strip from the pins. A flared surface (88) of the movable jaw (58) engages portions of the pins (24) to position the pins axially with respect to planar aligned surfaces (68) of the stationary jaw (56). The movable jaw (58) then clamps the pins (24) within the nests (66).

The strip (50) is separated from the pins (24) and the stationary and movable jaws (56 and 58) are moved to insert portions of the clamped pins into apertures (26) of a board (22).

26 Claims, 11 Drawing Figures

METHODS OF AND APPARATUS FOR ASSEMBLING ARTICLES WITH A SUPPORT

TECHNICAL FIELD

This invention relates to methods of and apparatus for assembling articles with a support, and particularly relates to methods of and apparatus for assembling a plurality of strip-held shoulder-containing pins within apertures of a supporting substrate.

BACKGROUND OF THE INVENTION

In the manufacture of some types of rigid pin-populated printed wiring boards, terminal pins are inserted into apertures of the boards and electrically engage portions of printed wiring on the boards to provide for connections to external circuits. Typically, the spacing between adjacent apertures on each board is extremely small. For example, the spacing between apertures on one board is 0.125 inch. Further, each terminal pin typically has a square cross section of, for example, 0.025 inch except in those areas where the pin is formed with lateral ears having a push shoulder and an aperture-engaging portion intermediate the ends thereof. The pin is relatively slender and typically measures one and one-half inches in length.

In assembling the pin within an aperture of a board, the end of the pin which is closest to the aperture-engaging portion is inserted into the aperture. A pushing force is then applied to the push shoulder of the pin to urge the aperture-engaging portion into the aperture whereby the pin is frictionally retained with the board.

Due to close spacing between apertures and the small size of the pin, it is most difficult and tedious to assemble the pins on an individual basis. Additionally, the relatively small size and slenderness of the pins necessitates delicate handling during insertion of the pins into the apertures. However, where each board may contain thousands of closely-spaced apertures, efficiency and economy dictate that the pins be prealigned and gang-inserted into the board apertures.

In the past, many techniques have been developed for assembling pins or terminals with a supporting structure. For example, in one technique, a supporting structure containing apertures is placed in a generally horizontal plane within a vibratory device. A plurality of individual slender pins are deposited on top of the supporting structure which is then vibrated. The pins are then vibratorily directed into the apertures. The vibratory technique requires that the pins be separated from each other before being deposited onto the supporting structure and that they be generally slender without any unbalancing structure such as lateral ears. Examples of the vibratory technique are illustrated in U.S. Pat. Nos. 3,667,103 and 3,812,569.

In another technique, the pins are stamped in a linked configuration having an edge-strip carrier. The pins are then fed into an insertion machine in the linked configuration and are separated individually from the carrier. Each of the separated pins are fed individually and independently of the other separated pins through feed chutes and assembled with a supporting structure. Examples of this technique are illustrated in U.S. Pat. Nos. 2,814,802; 2,970,370; 3,067,902; 3,566,464; and 3,867,760.

In a similar technique, strip-carried pins or terminals are separated one at a time from the linked assembly and assembled with a supporting structure. Examples of this technique are illustrated in U.S. Pat. Nos. 3,711,922 and 3,867,760.

Another technique provides for the simultaneous assembly of pins with a supporting structure as the pins are held in a linked comb-like arrangement by a carrier strip. After assembly of the pins with the structure, the strip is separated from the pins. Examples of this technique are illustrated in U.S. Pat. Nos. 3,676,926; 3,769,679; 3,875,636; and 3,946,477.

In a variation of the strip-held insertion technique, just noted above, a plurality of rows of pins are linked in an end-to-end configuration with laterally aligned pins of the rows forming sets of pins. Lateral linking strips define each set of pins. The leading set of pins with the lateral linking strip is separated from the trailing sets and assembled with a bobbin. After the bobbin and assembled pins are processed through several pin-staking steps, the lateral linking strip is separated. This technique is illustrated in U.S. Pat. No. 3,562,903.

In still another technique illustrated in U.S. Pat. No. 3,545,606, individual pins are assembled in a precise arrangement with a carrier pad. The pins are inserted into apertures of a supporting structure and the carrier pad is removed.

U.S. Pat. Nos. 2,871,551 and 2,947,965 illustrate an assembly of pins linked by carrier strips. Although not illustrated, it is generally noted that strip carried pins of this type can be fed into automatic machines for assembly of the pins with supporting structures. However, neither of these patents suggest specific techniques for such assembly of the pins with the supporting structures.

In another technique disclosed in U.S. Pat. No. 3,550,250, a plurality of pins are formed in a parallel spaced arrangement with a carrier strip and an anti-distortion strip extending along opposite ends of the pins to form a linked assembly. The pins are formed in sets of three each with the outer pins of each set being identical and the center pin being dissimilar. The set of pins of the linked assembly are advanced into an apparatus whereat the anti-distortion strip is removed from the leading set of three pins. Thereafter, an intermediate portion of the center pin of the leading set is clamped and the center pin is then separated from the carrier strip while the two outer pins of the set are retained with the carrier strip. A prepositioned bobbin is then moved to insert relatively the three pins into apertures of the bobbin. The carrier strip, which remains linked to the two outer pins of the leading set and all other pins of the trailing sets, is then utilized to advance the bobbin through a series of stations whereat various operations are performed. Therefore, this technique teaches initially clamping a single pin of a set of strip-held pins, then separating only the single clamped pin from the strip, inserting the clamped pin and the strip-held pins into a bobbin and utilizing the strip to transport the pin-bobbin assembly. Further, use of the strip to transport the pin-bobbin assembly tends to place stresses on the inserted pins which are still retained with the strip. This is particularly critical when the pins are slender.

In still another technique illustrated in U.S. Pat. No. 3,641,646, three independent rows of end-to-end linked pins are fed into a machine and the leading pin of each row is initially clamped while the pins are separated from the trailing pins. The clamped pins are then inserted into a bobbin. It is noted that the three pins are not initially linked together in any way and thereby do not contain a carrier strip. Thus any alignment necessary for insertion must depend on the manner of feeding the individual rows of pins into the machine.

SUMMARY OF THE INVENTION

A plurality of individual articles such as pins, which are initially integrally held in a precise spaced alignment by a carrier strip extending between adjacent portions of the pins, are to be simultaneously inserted into apertures of a support structure.

In a method for assembling the pins with the support structure, in accordance with certain principles of the invention, the carrier-strip held pins are moved into a plurality of nests of a pin applicator. As the pins are being moved into the nests, the carrier strip is separated from the pins. Intermediate portions of the pins are then clamped within nests of the pin applicator whereby the pins are held individually with the pin applicator in the precise spaced alignment. The pin applicator is then moved toward the support structure to insert the individually held pins into apertures of the support structure.

An apparatus for inserting the pins into apertures of a support structure, in accordance with certain principles of the invention, includes means for receiving intermediate portions of the carrier-strip held pins. Means are provided for separating the carrier strip from the pins as the pins are being moved into the receiving means. Means are provided for then clamping the intermediate portions of the pins within the receiving means. Means for moving the receiving and clamping means with the individually held pins then provide for the insertion of the pins into the apertures of the support structure.

DETAILED DESCRIPTION

Figures 1, 2, 4, 5:
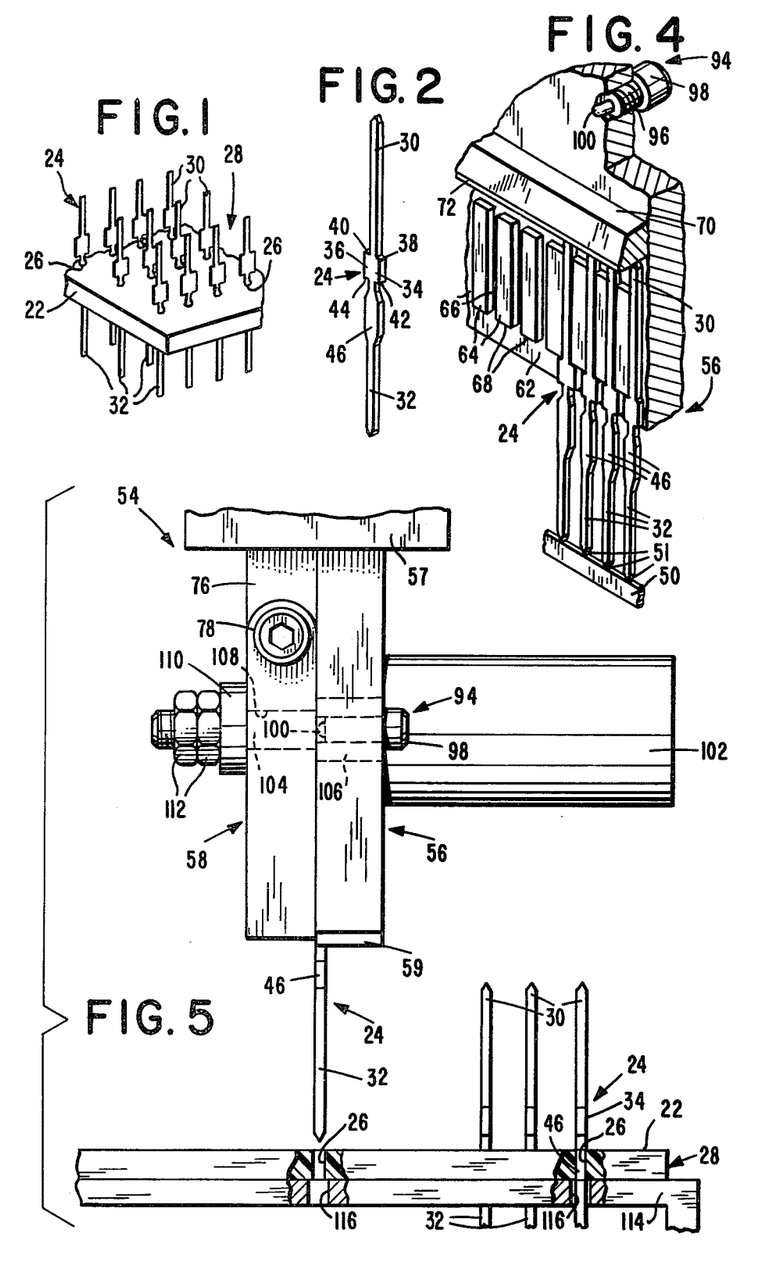
FIG. 1 is a partial perspective view showing a substrate support having a plurality of terminal pins mounted therein.
FIG. 2 is a perspective view showing one of the terminal pins of FIG. 1.
FIG. 4 is a partial perspective view showing structural features of a portion of the apparatus of FIG. 2.
FIG. 5 is a partial side view of FIG. 3 showing the apparatus in position to assemble terminal pins into a substrate support.

Referring now to FIG. 1, there is illustrated a substrate support such as a printed wiring board 22. A plurality of terminal pins, designated generally by the numeral 24, are assembled in apertures 26 of the board 22 to form a pin-populated board assembly designated generally by the numeral 28. The assembly 28 can be used in a variety of ways to provide interconnection for electronic circuits such as those used, for example, in communication networks.

Referring to FIG. 2, the terminal pin 24 is formed from blank stock (not shown) to include axially aligned shank portions 30 and 32 at opposite ends thereof. The end of the shank portion 32 is to be inserted into the aperture 26 of the board 22 while the end of the shank portion 30 is a non-inserting end. Lateral ears 34 and 36 are formed intermediate the ends of the pin 24 adjacent the shank portion 30 and include shoulder or push surfaces 38 and 40, respectively, closest the the shank portion 30 and undersurfaces 42 and 44, respectively, closest to the shank portion 32. The pin 24 is also formed with a board-engaging, pin-retaining portion 46 which is eventually located within one of the apertures 26 (FIG. 1) of the board 22 and is designated to facilitate removable retention of the pin with the board. The design of the pin-retaining portion 46 of the pin 24 could be an enlarged section as illustrated in FIG. 2 which could be urged into the aperture 26 of a smaller dimension so that the pin is frictionally held with the board 22. Also, the design of the pin-retaining portion 46 of the pin 24 could be a compliant section of sufficient dimension to fit compliantly within the aperture 26 and thereby removably retain the pin with the board 22. An example of a compliant section which could be utilized is illustrated in U.S. Pat. No. 4,076,356.

Figure 3:
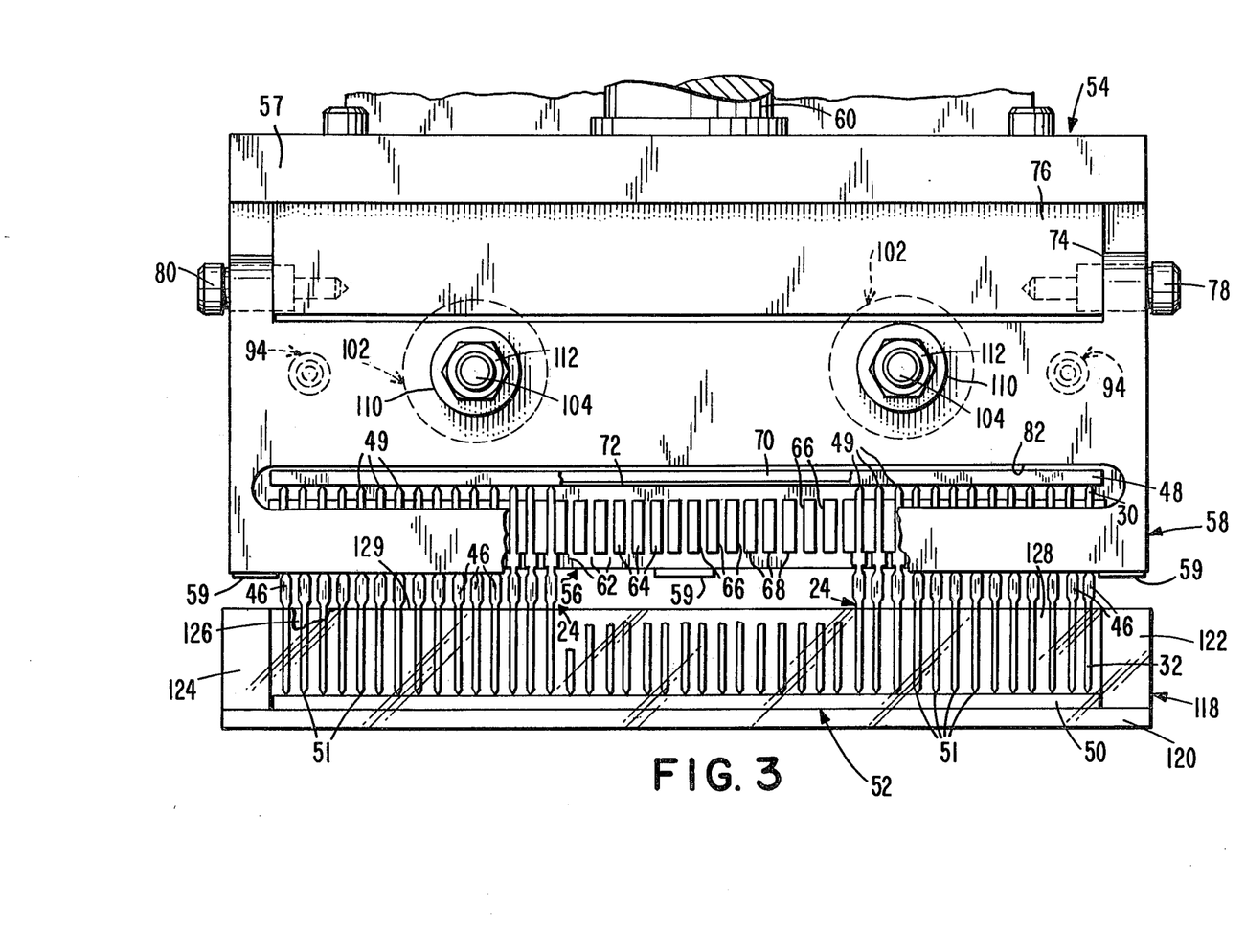
FIG. 3 is a partial plan view showing an integral assembly of terminal pins assembled with an apparatus for inserting the terminal pins into apertures of the substrate support of FIG. 1 in accordance with certain principles of the invention.

Referring to FIG. 3, there is illustrated a plurality of terminal pins 24 which have been formed in a predetermined uniform spacing from blank stock (not shown) during a punching and stamping operation. The pins 24 are held in the uniform spacing by integrally attached end-carrier strips 48 and 50 also formed from the blank stock in the same punching and stamping operation. The pins 24 and end-carrier strips 48 and 50 form a multiple pin assembly designated generally by the numeral 52. The ends of the shank portions 30 and 32 of the pins 24 which are linked integrally with the end-carrier strips 48 and 50, respectively, are scored at points 49 and 51, respectively, to facilitate subsequent easy removal of the strips from integral attachment with the pins.

A technique and facility are needed for simultaneously and efficiently inserting a plurality of the pins 24 into apertures 26 of the board 22 while insuring and maintaining the structural integrity and straightness of the pins.

A pin applicator, designated generally by the numeral 54, is designed to receive and clamp, within the applicator and in the predetermined spacing, a major portion of the shank portions 30 of each of the pins 24 of the pin assembly 52 while removing the strip 48 at the scored points 49 as the pins are being received. The strip 50 can then be removed at the scored points 51 and the pins 24 inserted into the apertures 26 (FIG. 1) of the board 22 by pushing on the shoulders 38 and 40 (FIG. 2). The use of the pin applicator 54 provides for the simultaneous and efficient assembly of the plurality of pins 24 with the board 22 without disturbing the integrity of the structure of the pins.

Referring to FIGS. 3 and 5, the applicator 54 includes a stationary jaw, designated generally by the numeral 56, and a movable jaw, designated generally by the numeral 58, which is movable relative to the stationary jaw. The stationary jaw 56 is secured to a top plate 57 which is attached to an overhead ram 60 (partially shown) and which forms an operable portion of a press (not shown). The press is operable to move the ram 60 vertically, as viewed in FIGS. 3 and 5, and to thereby move the stationary and movable jaws 56 and 58 therewith. The lower surface of the movable jaw 58 extends below the lower surface of the stationary jaw 56. Three stop-travel pads 59 are secured at spaced locations to the lower surface of the stationary jaw 56 and extend beyond the lower surface of the movable jaw 58. Each of the pads 59 is formed with a board-engaging undersurface 61.

Referring to FIGS. 3 and 4, the stationary jaw 56 is formed in one face 62 thereof with a plurality of spaced rectangular protrusions 64. The protrusions 64 extend from the face 62 by a distance slightly less than the thickness of the pin 24. Each adjacent pair of the protrusions 64 forms therebetween one of a plurality of nests 66. Each of the nests 66 is dimensioned in width to receive the shank portion 30 of the pin 24 and has a depth dimension slightly less than the thickness of the pin. Each protrusion 64 also includes a pin-shoulder engaging surface 68 which is located a precise distance from the undersurfaces 61 of the pads 59 with the engaging surfaces being in planar alignment within the pin applicator 54. A stripper bar 70 is also formed on the face 62 of the stationary jaw 56 and includes a flat face 72 to facilitate subsequent separation of the end-carrier strip 48 from the plurality of pins 24.

Referring to FIG. 3, the movable jaw 58 is formed with a cutout 74 which fits about a forward extension plate 76 which is secured to the stationary jaw 56. This facilitates the securing of the movable jaw 58 to the stationary jaw 56 by pivot pins 78 and 80 to permit pivotal movement of the movable jaw relative to the stationary jaw. The movable jaw 58 is formed with an elongated opening 82 which is generally aligned with the stripper bar 70 to provide for visual sighting of the multiple pin assembly 52 with the nests 66 and to facilitate ready removal of the separated end-carrier strip 48 of the multiple pin assembly.

Figures 6, 7, 11:
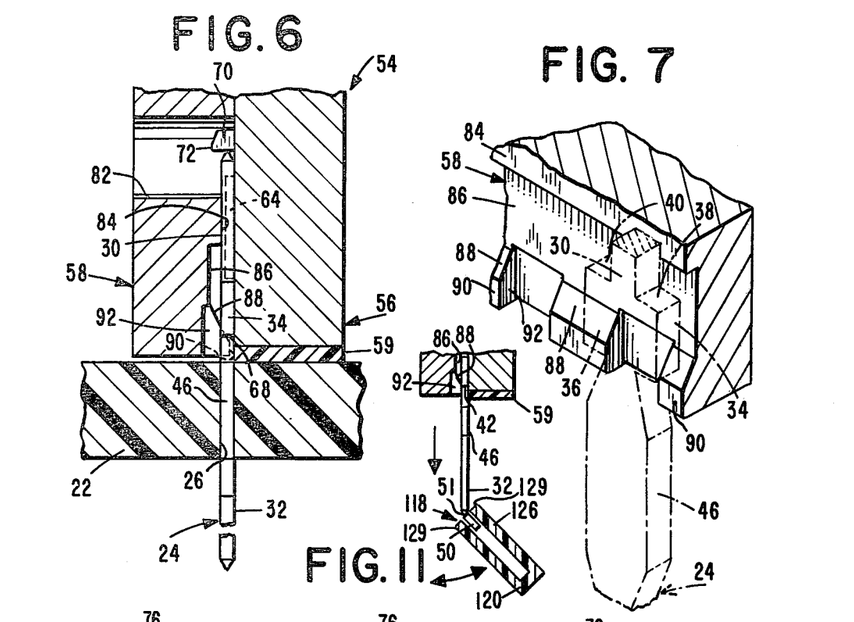
FIG. 6 is a partial sectional view showing a terminal pin held within the apparatus of FIG. 3 and assembled with the support substrate of FIG. 1.
FIG. 7 is a partial perspective view showing a portion of the terminal pin in engagement with a portion of the apparatus of FIG. 3.
FIGS. 8, 9, 10 and 11 are schematical views showing the steps of assembling the comb of terminal pins of FIG. 3 with the apparatus of FIG. 3.

As illustrated in FIG. 7, the movable jaw 58 is formed with an inner face 84 which is positioned adjacent to the protrusions 64 of the stationary jaw 56. The cutout 86 is formed in the face 84 generally from side to side thereof with a flared surface 88 extending downwardly and outwardly to a foot surface 90. A plurality of spaced notches 92 are formed in the foot surface 90 and extend beyond the flared surface 88. The foot surface 90 is located in a plane which is forward of the plane of the inner face 84 as viewed in FIGS. 5 and 6. The notches 92 are aligned with the nests 66 of the stationary jaw 56 (FIG. 3) with each notch ultimately receiving a portion of one of the pins 24 as illustrated in phantom in FIG. 7.

Figure 8:
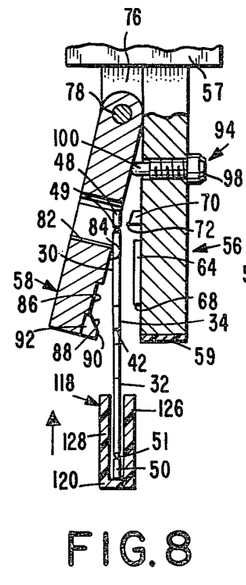
Figure 9:
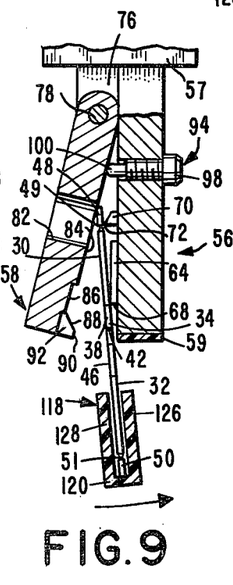

Referring to FIG. 4, a pair of spring-biasing elements, designated generally by the numeral 94 (one shown), are mounted at spaced locations in the stationary jaw 56 (FIG. 3) and facilitate normal separation of the movable jaw 58 from the stationary jaw as illustrated in FIGS. 8 and 9. Each of the spring-biasing elements 94 includes an externally threaded sleeve 96 formed with a head 98 on one end thereof which is mounted within a threaded aperture in the stationary jaw 56. A plunger tip 100, which is captured for movement within the sleeve 96, protrudes movably from the other end of the element 94 and is urged to this position by a spring (not shown) within the sleeve. The spring normally urges the plunger tip 100 of each element 94 to an extended position, as illustrated in FIGS. 8 and 9, whereby the tip engages and moves the movable jaw 58 to a pivoted or open position relative to the stationary jaw 56. The location of the elements 94 are also illustrated in FIG. 3.

As illustrated in FIG. 5, a pair of air cylinders 102 (one shown) are secured to the stationary jaw 56. Each of the air cylinders 102 has a piston rod 104 which extends through a bushing 106 mounted in the stationary jaw 56 and further through an aperture 108 formed in the movable jaw 58. A spherical washer 110 and a pair of nuts 112 are mounted threadedly on the free end of the piston rod 104 to capture the stationary jaw 56 and the movable jaw 58 between the washer and the air cylinder 102. The physical location of the air cylinders 102 are also illustrated in FIG. 3.

Figure 10:
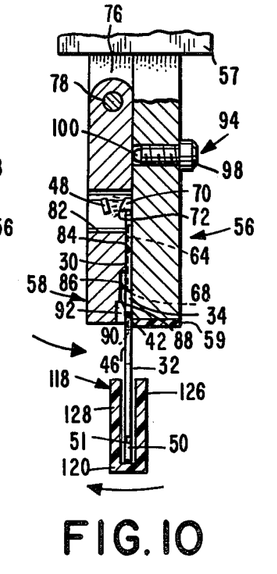

When each of the air cylinders 102 is operated to draw the piston rod 104 further within the air cylinder, the washer 110 moves the movable jaw 58 against the biasing action of the spring-biasing elements 94 to a position adjacent to the stationary jaw 56 as illustrated in FIGS. 5, 6 and 10. When each of the air cylinders 102 is operated to move the piston rod 104 outwardly from within the air cylinder, the washer 110 is moved away from the movable jaw 58. The springs of the spring-biasing elements 94 then facilitate outward movement of the plunger tips 100 and thereby moves the movable jaw 58 to the open position as illustrated in FIGS. 8 and 9.

Referring to FIG. 5, when the pin applicator 54 is to be used to insert the pins 24 into the board 22, the board is placed on a support table 114 so that the apertures 26 of the board are located over apertures 116 formed in the support and which are larger than the board apertures. The apertures 116 of the table 114 are sufficiently large to permit free entry and passage of any portion of the pins 24 which will normally extend below the board 22 such as the shank portions 32. This provides for ready removal of the pin-populated board assembly 28 upon completion of the insertion of all pins 24 in the apertures 26 of the board 22.

Referring to FIG. 8, the air cylinders 102 (FIGS. 3 and 5) are operated to facilitate movement of the movable jaw 58 to the open position. The lower portion of the multiple pin assembly 52 is then positioned into a top opening of a carrier, designated generally by the numeral 118, which is also illustrated in FIG. 3. The carrier 118 includes a base 120, two end members 122 and 124 and two spaced side walls 126 and 128. The base 120, end members 122 and 124, and the side walls 126 and 128 are fastened together to form an open-top enclosure for receiving the lower portion of the pin assembly 52 and supporting the assembly for manual transport. The side walls 126 and 128 are each formed with an upper planar surface 129 which are in alignment with each other. The carrier 118 can be composed of any suitable material such as, for example, a lightweight plastic.

Referring further to FIG. 8, the carrier 118 is then manipulated to position the pin assembly 52 into the opening between the stationary jaw 56 and the movable jaw 58 so that the strip 48 is located adjacent to the stripper bar 70. In addition, the shank portion 30 of the pins 24 are aligned with the nests 66. The opening 82 of the movable jaw 28 facilitates visual locating of the strip 48 relative to the stripper bar 70 and the shank portions 30 relative to the nests 66.

Referring to FIG. 9, the carrier 118 is moved to the right to position the shoulder surfaces 38 and 40 of each pin 24 into engagement with the front edge of the engaging surfaces 68 of the protrusions 64 with the strip 48 remaining essentially aligned with the flat face 72 of the stripper bar 70. The air cylinders 102 are then operated to pivot the movable jaw 58 toward the stationary jaw 56 as illustrated in FIG. 10.

As the movable jaw 58 approaches the stationary jaw 56, the inner face 84 of the movable jaw engages a major portion of an adjacent face of the shank portion 30 of each of the pins 24 of the multiple pin assembly 52 and urges the shank portions into the aligned nests 66 of the stationary jaw. Simultaneously, the end-carrier strip 48 is urged into engagement with the flat face 72 of the stripper bar 70 whereby a torque action occurs to bend the strip 48 at each of the scored points 49 whereat the strip is integrally joined with each pin 24. This results in the separation or severance of the strip 48 from the pins 24 as illustrated in FIG. 10. As noted above, the stripper bar 70 is aligned with the elongated opening 82 of the movable jaw 58 and facilitates ready removal of the separated end-carrier strip 48 from the area of the pin applicator 54 prior to insertion of the pins 24 into the apertures 26 of the board 22. As the inner face 84 of the movable jaw 58 is urging the shank portions 30 of the pins 24 into the nests 66, the multiple pin assembly 52 is being oriented into a vertical position which causes the carrier 118 to move to the left as viewed in FIG. 10.

Thus, the strip 48 is separated from the pins 24 while the pins are being pressed into the nests 66. Therefore, the structural integrity and straightness of the pins 24 is maintained by the pin applicator 54.

As the movable jaw 58 is being pivoted to the right as illustrated in FIG. 10, the flared surface 88 of the movable jaw engages the undersurfaces 42 and 44 of each of the pins 24 and urges the pins upwardly axially thereof to insure that the shoulder surfaces 38 and 40 are pressed snugly into engagement with the engaging surfaces 68 of the stationary jaw 56. In this manner, the ears 34 and 36 of each of the pins 24 are captured between the flared surface 88 and the engaging surfaces 68 to thereby accurately locate each of the pins along its axis within and with respect to the pin applicator 54 for subsequent insertion into the apertures 26 (FIGS. 1 and 5) of the board 22. Additionally, this insures that the shoulder surfaces 38 and 40 of each pin 24 are in planar alignment with the shoulder surfaces of all other pins in the multiple pin assembly 52. Also, as noted above, each of the notches 92 (FIG. 7) formed in the movable jaw 58 receives a portion of one of the pins 24 as the pins are being located within the pin applicator 54.

As noted above, and as illustrated in FIGS. 4 and 6, the depth of the nests 66 as defined by the protrusion 64 is slightly less than the thickness of the pins 24 so that, when the shank portions 30 are fully positioned within the nests, a forward portion of each of the shank portions extends outside the nests. In this manner, the inner face 84 of the movable jaw 58 is continuously pressing the shank portions 30 of the pins 24 against the back wall of the nests 66 whereby the shank portions 30, and the pins, are clamped with the pin applicator 54 as viewed in FIGS. 6 and 10.

Thereafter, as viewed in FIG. 11, the carrier 118 is lowered until the planar surfaces 129 are parallel to the scored points 51. The strip 50 is then separated from the pins 24 by rocking the carrier 118 along the scored points 51 to flex and separate the strip whereby the pins are now individually supported in the predetermined uniform spacing by the pin applicator 54 for insertion into the apertures 26 of the board 22 as illustrated in FIG. 5. The separated strip 50 deposits into the carrier 118 which is then removed from the area of the pin applicator 54.

The ram 60 (FIG. 5) is then lowered to facilitate insertion of the plurality of pins 24, held by the pin applicator 54, into the apertures 26 of the board 22. The shank portions 32 of the pins 24 move freely through the apertures 26 and through the apertures 116 of the table 114 until the pin-retaining portions 46 begin to enter the apertures 26. Then a pushing force is required and is applied to the shoulder surfaces 38 and 40 through the engaging surfaces 68 of the stationary jaw 56. Some pushing force is also transmitted through the clamped portions of the shank portions 30 of the pins 24.

During this period when the portions 46 are being urged into the apertures 26, the shank portions 30 of the pins 24 are firmly clamped so that the structural integrity of the pins is not disturbed. In addition, no pushing force is applied to the tip ends of the shank portions 30 the structural integrity of which is important in later utilization of the pin-populated board assembly 28. The pins 24 are thereby guided into the apertures 26 and the pin-retaining portions 46 are positioned in the apertures to facilitate retention of the pins with the board 22.

Eventually the undersurfaces 61 of the feet 59 engage and rest on the upper surface of the board 22 to thereby limit and stop the downward movement of the ram 60. As noted above, the undersurfaces 61 of the feet 59 are located a precise distance from the pin-shoulder engaging surfaces 68 of the stationary jaw 56 thereby providing that the shoulder surfaces 38 and 40 are located, by the precise distance, above the upper surface of the board 22. This satisfies a requirement that the ears 34 and 36 of all of the pins 24 in the board 22 be located a uniform distance above the adjacent surface of the board.

After the pins 24 have been assembled with the board 22, the air cylinders 102 are operated to move the piston rods 104 outwardly from the air cylinders. The movable jaw 58 is then moved to the open position under the urging of the spring-biasing elements 94 to unclamp the shank portions 30. The ram 60 is then moved upwardly to reveal the pins 24 fully assembled with the board 22.

While the foregoing description relates to a single multiple pin assembly 52 of a given number of pins 24, the carrier 118 can be modified internally to receive several spaced strip-supported multiple pin assemblies each of a lesser number of pins 24 than the given number of the illustrated pin assembly. The carrier 118 is manipulated in the same manner as described above and the pins 24 are inserted in the same manner without departing from the spirit and scope of the invention.

Further, the multiple pin assembly 52 could include initially only one carrier strip. For example, the pin assembly 52 could include either the strip 48 or the strip 50 to retain the pins 24 in the spaced alignment. If the strip 48 is used, the strip would be removed in the same manner as described above by the stripper bar 70. If the strip 50 is used, the strip would be removed by rocking the prepositioned carrier 118, as illustrated in FIG. 11, after the pin assembly 52 has been positioned in the nests 66 and clamped with the pin applicator 54.

I claim:

1. A method of simultaneously inserting one end of each of a plurality of individual pins into apertures of a support structure in a precise spaced alignment where the pins are initially integrally held in the spaced alignment by a carrier strip extending between adjacent end portions of the pins, which comprises the steps of:

moving an intermediate portion of each of the integrally held pins into one of a plurality of nests of a pin applicator with the nests being spaced in the precise alignment;

separating the carrier strip from the pins as the pins are being moved into the nests;

clamping the intermediate portions of the pins within the nests so that the pins are held individually with the pin applicator in the precise alignment; and moving the pin applicator toward the support structure with the clamped pins until the one end of each of the pins is inserted into an aperture of the support structure.

2. The method of simultaneously inserting one end of each of a plurality of individual pins into apertures of a support structure as set forth in claim 1 wherein the step of separating the carrier strip comprises the step of moving the carrier strip into a stripper bar as the intermediate portions of the pins are being moved into the nests to develop a torque action between the carrier strip and the pins to separate the strip from the pins.

3. The method of simultaneously inserting one end of each of a plurality of individual pins into apertures of a support structure as set forth in claim 1, which further comprises the step of precisely positioning each of the pins along its axis with respect to the pin applicator prior to the clamping of the intermediate portions of the pins within the nests with a corresponding portion of each pin being placed in planar alignment with the corresponding portions of all other pins.

4. The method of simultaneously inserting one end of each of a plurality of individual pins into apertures of a support structure as set forth in claim 3 wherein the corresponding portions of each pin are to be located a precise distance from the support structure after insertion thereof, which further comprises the step of stopping the movement of the pin applicator in a predetermined relation to the support structure to locate the planar aligned corresponding portions of each pin the precise distance from the support structure.

5. A method of simultaneously inserting one end of each of a plurality of individual pins into apertures of a support structure in a precise spaced alignment where the pins are initially integrally held in the spaced alignment by a first carrier strip extending between adjacent portions at a non-inserting end of the pins and by a second carrier strip extending between adjacent portions at the one end of the pins, which comprises the steps of:

positioning an intermediate portion of each of the integrally held pins adjacent to one of a plurality of nests of a pin applicator with the nests being spaced in precise alignment;

moving the positioned intermediate portion of the integrally held pins into the nests;

separating the first carrier strip from the pins;

clamping the intermediate portions of the pins within the nests;

separating the second carrier strip from the pins whereby the pins are now individually clamped in the precise alignment with the pin applicator; and moving the pin applicator toward the support structure with the clamped pins until the one end of each of the pins is inserted into an aperture of the support structure.

6. The method of simultaneously inserting one end of each of a plurality of individual pins into apertures of a support structure as set forth in claim 5 wherein the step of separating the first carrier strip comprises the step of moving the first carrier strip into a stripper bar as the intermediate portions of the pins are being moved into the nests to develop a torque action between the carrier strip and the pins to separate the strip from the pins.

7. The method of simultaneously inserting one end of each of a plurality of individual pins into apertures of a support structure as set forth in claim 5, which further comprises the step of removing the separated first carrier strip from the area of the pin applicator.

8. The method of simultaneously inserting one end of each of a plurality of individual pins into apertures of a support structure as set forth in claim 5 which further comprises the step of locating the one end of the pins and the second carrier strip externally of the pin applicator when the intermediate portions are being positioned adjacent to, moved into and clamped within the nests to facilitate subsequent separation of the second carrier from the pins.

9. The method of simultaneously inserting one end of each of a plurality of individual pins into apertures of a support structure as set forth in claim 5, which further comprises the step of removing the separated second carrier strip from the area of the pin applicator.

10. The method of simultaneously inserting one end of each of a plurality of individual pins into apertures of a support structure as set forth in claim 5 wherein each pin is formed with at least one lateral ear intermediate the ends thereof and having a push surface closest to the non-inserting end and an undersurface closest to the one end and which further comprises the steps of:

pushing the undersurface of each pin, as the pins are being moved into the nests, to urge the pin axially in the direction of the non-inserting end; and locating the push surfaces of the urged pins against planar aligned surfaces of the pin applicator to provide for planar alignment of the ears of the pins within the pin applicator.

11. The method of simultaneously inserting one end of each of a plurality of individual pins into apertures of a support structure as set forth in claim 5, wherein the one end of each of the pins has been inserted into an aperture of the support structure, which further comprises the steps of:

unclamping the intermediate portions of the pins; and moving the pin applicator in a reverse direction away from the support structure having the pins assembled therewith.

12. A method of simultaneously inserting one end of each of a plurality of individual pins into apertures of a support structure in a precise spaced alignment where the pins are initially integrally held in the spaced alignment by a first carrier strip extending between adjacent portions at a non-inserting end of the pins and by a second carrier strip extending between adjacent portions at the one end of the pins, which comprises the steps of:

positioning the integrally held pins adjacent to a pin applicator where an intermediate portion of each of the integrally held pins is positioned adjacent to one of a plurality of nests of the pin applicator with the nests being arranged in the precise spaced alignment and where the one end of each pin and the second carrier are positioned externally of the pin applicator;

moving the positioned integrally held pins to:

(1) urge the first carrier strip into stripping engagement with a stripper bar to separate the first carrier strip from the pins; and
(2) position the intermediate portions of the integrally held pins into the nests;
moving the pins relative to the pin applicator to position corresponding portions of the pins into engagement with planar aligned portions of the pin applicator whereby the pins are located in a precise axial alignment within the pin applicator;
clamping the intermediate portions of the pins within the nests in the precise spaced and axial alignments;
separating the second carrier strip from the pins whereby the pins are now individually clamped in the precise spaced and axial alignment with respect to the pin applicator with the one end of each pin located externally of the pin applicator;
moving the pin applicator toward the support structure with the clamped pins until the one end of each of the pins is inserted into an aperture of the support structure;
stopping the movement of the pin applicator in predetermined relation to the support structure to locate the corresponding portions of the pins with respect to the support structure;
unclamping the intermediate portions of the pins; and
moving the pin applicator in a reverse direction away from the support structure having the pins assembled therewith.

13. An apparatus for simultaneously inserting one end of each of a plurality of individual pins into apertures of a support structure in a precise spaced alignment where the pins are initially integrally held in the spaced alignment by a carrier strip extending between adjacent end portions of the pins, which comprises:
means for receiving an intermediate portion of each of the integrally held pins in the precise spaced alignment;
means for separating the carrier strip from the pins as the pins are being moved into the receiving means so that the pins are held individually with the receiving means in the precise spaced alignment;
means for clamping the intermediate portions of the pins within the receiving means; and
means for moving the receiving and clamping means with the clamped individual pins in the precise spaced alignment toward the support structure until the one end of each of the pins is inserted into an aperture of the support structure.

14. The apparatus for simultaneously inserting one end of each of a plurality of individual pins into apertures of a support structure as set forth in claim 13 wherein the separating means includes a stripper bar which is positioned to engage the carrier strip as the intermediate portions of the pins are being placed within the receiving means whereby a torque action is developed between the carrier strip and the pins to separate the strip from the pins.

15. The apparatus for simultaneously inserting one end of each of a plurality of individual pins into apertures of a support structure as set forth in claim 13, which further comprises means for precisely positioning each of the pins along its axis with respect to the receiving means prior to the clamping of the intermediate portions of the pins within the receiving means so that a corresponding portion of each pin is placed in planar alignment with the corresponding portions of all other pins.

16. The apparatus for simultaneously inserting one end of each of a plurality of individual pins into apertures of a support structure as set forth in claim 15 wherein the corresponding portions of each pin are to be located a precise distance from the support structure after insertion thereof, which further comprises means for stopping the movement of the receiving and clamping means in a predetermined relation to the support structure to locate the planar aligned corresponding portions of each pin the precise distance from the support structure.

17. An apparatus for simultaneously inserting one end of each of a plurality of individual pins into apertures of a support structure in a precise spaced alignment where the pins are initially integrally held in the spaced alignment by a first carrier strip extending between adjacent portions at a non-inserting end of the pins and by a second carrier strip extending between adjacent portions at the one end of the pins, which comprises:
means for receiving an intermediate portion of each of the integrally held pins in the precise spaced alignment;
means for separating the first carrier strip from the pins;
means for clamping the intermediate portions of the pins within the receiving means;
means for separating the second carrier strip from the pins whereby the pins are now individually clamped in the precise alignment with the receiving means; and
means for moving the receiving and clamping means with the clamped individual pins in the precise alignment toward the support structure until the one end of each of the pins is inserted into an aperture of the support structure.

18. The apparatus for simultaneously inserting one end of each of a plurality of individual pins into apertures of a support structure as set forth in claim 17 which further comprises means for positioning the intermediate portions of the integrally held pins adjacent to the receiving means prior to the clamping of the pins within the receiving means.

19. The apparatus for simultaneously inserting one end of each of a plurality of individual pins into apertures of a support structure as set forth in claim 17 wherein the separating means includes a stripper bar which is positioned to engage the intermediate portions of the pins as the pins are being moved into the receiving means to develop a torque action between the carrier strip and the pins to separate the strip from the pins.

20. The apparatus for simultaneously inserting one end of each of a plurality of individual pins into apertures of a support structure as set forth in claim 17, which further comprises means for facilitating removal of the separated first carrier strip from the area of the receiving and clamping means.

21. The apparatus for simultaneously inserting one end of each of a plurality of individual pins into apertures of a support structure as set forth in claim 17 which further comprises means for locating the one end of the pins and the second carrier strip externally of the receiving and clamping means when the intermediate portions are being positioned adjacent to, moved into and clamped within the receiving means.

22. The apparatus for simultaneously inserting one end of each of a plurality of individual pins into apertures of a support structure as set forth in claim 17, which further comprises means for removing the separated second carrier strip from the area of the receiving and clamping means.

23. The apparatus for simultaneously inserting one end of each of a plurality of individual pins into apertures of a support structure as set forth in claim 17, wherein each pin is formed with at least one lateral ear intermediate the ends thereof and having a push surface closest to the non-inserting end and an undersurface closest to the one end and which further comprises:

the receiving means being formed with planar aligned surfaces in a location to engage the push surfaces of the received pins; and means
(1) for pushing the undersurface of each pin, as the pins are being moved into the receiving means, to urge the pin axially in the direction of the non-inserting end and
(2) for locating the push surfaces of the urged pins against the planar aligned surfaces of the receiving means to provide for planar alignment of the ears of the pins within the receiving means.

24. The apparatus for simultaneously inserting one end of each of a plurality of individual pins into apertures of a support structure as set forth in claim 17, wherein the one end of each of the pins has been inserted into an aperture of the support structure, which further comprises:

means for moving the clamping means away from the intermediate portions of the pins to unclamp the pins; and means for moving the receiving and clamping means in a reverse direction away from the support structure having the pins assembled therewith.

25. An apparatus for simultaneously inserting one end of each of a plurality of individual pins into apertures of a support structure in a precise spaced alignment where the pins are initially integrally held in the spaced alignment by a first carrier strip extending between adjacent portions at a non-inserting end of the pins and by a second carrier strip extending between adjacent portions at the one end of the pins and further where each pin is formed with at least one lateral ear intermediate the ends thereof and having a push surface closest to the non-inserting end and an undersurface closest to the one end, which comprises:

a stationary jaw;

a movable jaw;

means for supporting the movable jaw adjacent to and movable relative to the stationary jaw;

a plurality of pin-receiving nests formed in one face of the stationary jaw adjacent to the movable jaw, the nests being in the same precise spaced alignment as the integrally held pins;

the movable jaw being formed with a pin-clamping surface adjacent to and facing the nests of the stationary jaw;

means for normally urging the movable jaw in a spaced position relative to the stationary jaw to facilitate the positioning between the stationary and movable jaws of the first carrier strip, the lateral ear and shank portions therebetween of the integrally held pins;

the stationary jaw being formed in the one face thereof with planar aligned surfaces for engagement with the push surfaces of the pins;

a stripper bar extending from the one face of the stationary jaw toward the movable jaw;

means formed on the movable jaw for engaging the undersurface of each of the pins;

means for moving the movable jaw toward the stationary jaw whereby the pin-clamping surface presses and clamps the shank portions of the pins into the nests and the first carrier strip is moved into the stripper bar to separate the strip from the pins;

means formed on the movable jaw for engaging the undersurface of the pins as the movable jaw is moved to urge the push surface of each pin into engagement with the planar aligned surfaces;

means for separating the second strip from the one end of each of the pins; and means for moving the stationary and movable jaws to insert the one end of the pins into the apertures of the support structure.

26. The apparatus as set forth in claim 25 which further comprises:

means formed as a portion of the stationary jaw for:
(1) engaging the support structure when the stationary jaw is being moved toward the support structure, and
(2) stopping movement of the stationary and movable jaws.

* * * * *